United States Patent [19]

Morozumi

[11] 3,939,642

[45] Feb. 24, 1976

[54] ELECTRONIC TIMEPIECE SEMICONDUCTOR INTERGRATED CIRCUIT

[75] Inventor: Shinji Morozumi, Nagano, Japan

[73] Assignee: Kabushiki Kaisha Suwa Seikosha, Tokyo, Japan

[22] Filed: Jan. 2, 1974

[21] Appl. No.: 429,992

[30] Foreign Application Priority Data

Dec. 29, 1972 Japan..................................... 48-503

[52] U.S. Cl........... 58/23 A; 58/23 AC; 307/220 C; 357/42
[51] Int. Cl.²..................... G04C 3/00; H03K 21/00
[58] Field of Search........ 58/23 A, 23 AD; 307/220; 317/235 G

[56] References Cited

UNITED STATES PATENTS

| | | | |
|---|---|---|---|
| 3,585,527 | 6/1971 | Luscher | 331/116 R |
| 3,715,604 | 2/1973 | Rapshy | 307/22 D |
| 3,757,510 | 9/1973 | Dill | 58/50 R |

OTHER PUBLICATIONS

J. D. Wilcock, Most Digital Logic Circuits in Silicon Films Deposited, Sapphire Substrates, Solid-State Electronics, 1971, Vol. 14, pp. 315–325.
H. W. Kaiser et al., Recent Developments in CMOS/-SOS, RCA Engineer, 8-1972, pp. 68–72.

Primary Examiner—Edith Simmons Jackmon
Attorney, Agent, or Firm—Blum, Moscovitz, Friedman & Kaplan

[57] ABSTRACT

A semiconductor integrated circuit especially suitable for use in electronic timepieces to improve the operation thereof is provided. An integrated circuit chip including complementary coupled P-channel and N-channel MOS field effect transistors having insulation placed therebetween by forming same spaced on an insulating substrate. The insulation effects reduced current consumption to thereby enhance the life of the battery in an electronic timepiece.

9 Claims, 9 Drawing Figures

ELECTRONIC TIMEPIECE SEMICONDUCTOR INTERGRATED CIRCUIT

BACKGROUND OF THE INVENTION

This invention relates generally to a semiconductor integrated circuit and especially to a semiconductor integrated circuit for use in an electronic timepiece. While electronic timepieces have taken various forms, it is commonly recognized that it is desirable to integrate as much of the circuitry thereof as possible in order to decrease the size of the electronic timepiece and render such circuitry especially suitable for use in a wristwatch. However, it has been found that integrated circuits have wiring capacitances and junction capacitances which result in an increase in the parasitic capacitance thereof, thereby increasing the current consumption when circuits operate at high frequencies. It is appreciated that in an electronic timepiece the battery must be limited in size due to the limited space in the wristwatch. Thus, as the use of current is increased by the parasitic capacitance, the battery life is considerably shortened. Accordingly, it is desired to provide a semiconductor integrated circuit member which overcomes the above-mentioned disadvantages.

SUMMARY OF THE INVENTION

Generally speaking, in accordance with the invention, an integrated circuit chip including complementary coupled P-channel and N-channel MOS field effect transistors having insulation therebetween is provided. The P-channel and N-channel transistors are disposed on a semiconductor insulating substrate layer by forming semiconductor layers thereon. Such complementary coupled field effect transistor circuit chips are especially suitable for use in small-sized electronic timepiece circuitry for enhancing the operation thereof while maintaining the size thereof at a minimum.

Accordingly, it is an object of this invention to provide an improved electronic timpiece including semiconductor integrated circuitry.

Another object of this invention is to provide an integrated circuit chip for a small-sized electronic timepiece which is capable of operating at high frequencies in accordance with the natural frequency of the quartz crystal vibrator provided.

Another object of this invention is to provide an improved integrated circuit chip which is adapted to utilize a minimum amount of current during high frequency operation.

Still another object of the instant invention is to provide semiconductor integrated circuit chips for an electronic wristwatch which are easy to manufacture yet have highly reliable operating characteristics.

Still other objects and advantages of the invention will in part be obvious and will in part be apparent from the specification.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawing, in which.

DESCRIPTION OF THE PREFERRED EMBODIMENT

Figure 1:
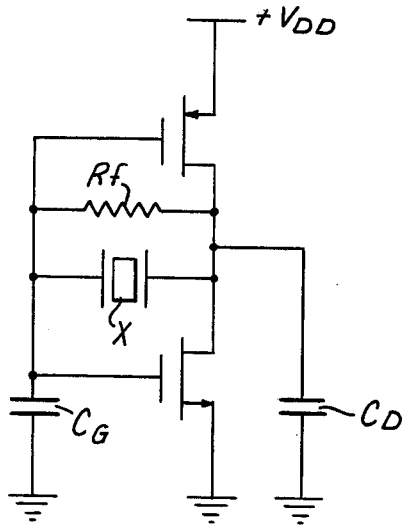
FIG. 1 is a circuit diagram of a quartz crystal oscillator circuit especially suitable for use in an electronic timepiece constructed in accordance with the prior art.
Figure 9:
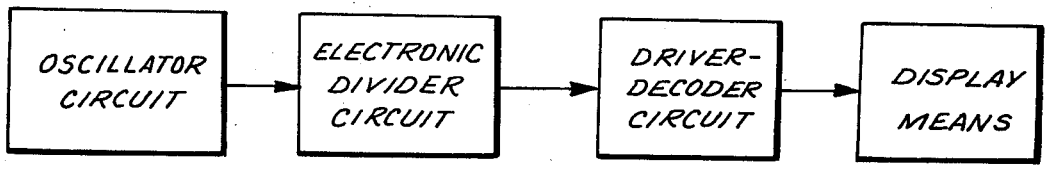
FIG. 9 is a block diagram of an electronic timepiece constructed in accordance with the prior art.
Figure 3:
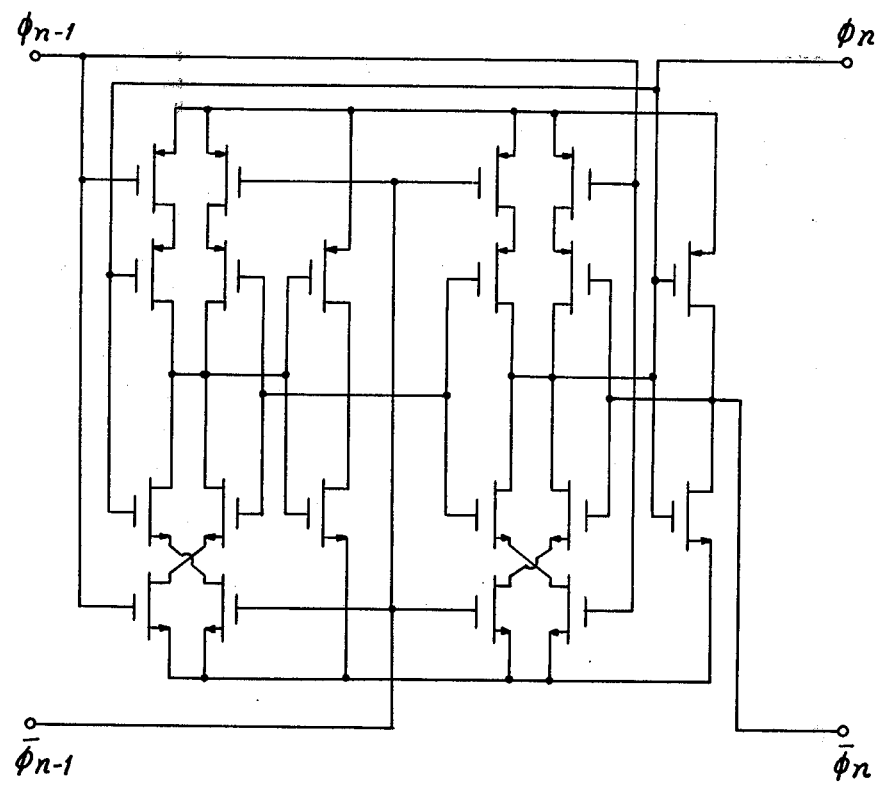
FIG. 3 is a static electronic divider circuit especially suitable for use in an electronic timepiece.
Figure 4:
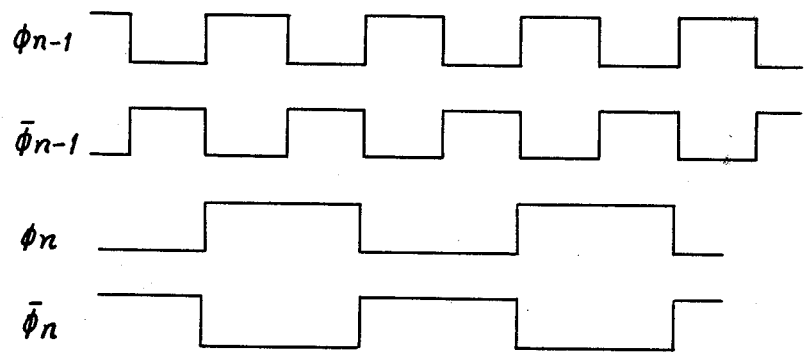
FIG. 4 shows a wave diagram for the electronic divider circuit depicted in FIG. 3.

Reference is made to FIG. 9 wherein a conventional electronic timepiece circuit is depicted. A quartz crystal oscillator circuit provides a high frequency timekeeping signal to an electronic divider circuit which is comprised of multi-stage counters which produce a low frequency timekeeping signal corresponding to present time. A driver-decoder circuit receives the low frequency timekeeping signals and supplies signals to a display to energize same to display the time counted by the electronic divider circuit. Generally speaking, the Q-value of such a circuit is extremely high. The Q-value is determined by three circuits, namely, the oscillator circuit, the divider circuit, and the driver-decoder circuit. Generally, an electronic wristwatch will include all the circuits on a single chip or will provide such a chip in combination with other circuits. Reference is made to FIG. 1 wherein a prior art quartz crystal oscillator circuit which is rendered easy to oscillate by a quartz crystal vibrator is depicted. Similarly, in FIGS. 3 and 4 are respectively depicted static electronic divider circuits which are utilized in electronic timepieces by integrating same into the circuit chip and the waveforms thereof.

Figure 2:
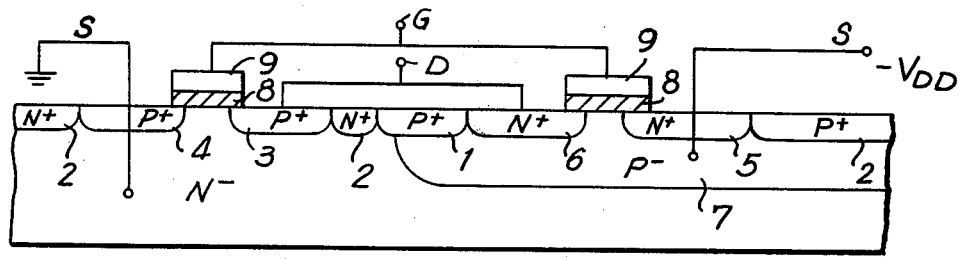
FIG. 2 is a sectional view of a complementary coupled P-channel and N-channel field effect transistor integrated into a single substrate in accordance with the prior art.

Reference is made to FIG. 2 wherein two insulated Aluminum gate field transistors are complementary coupled at the drain terminals D and at the gate terminals G and are integrated into a chip in accordance with the prior art.

It is appreciated that the integrated circuit chip of FIG. 2 having a semiconductor substrate includes a first source terminal S of said source terminals being coupled to a supply voltage $V_{DD}$. The source terminals S are coupled to the source regions 4 and 5. The drain terminals D are coupled to the drain regions 3 and 6. Finally, the gate terminal is coupled through a conductive layer 9, formed of aluminum, to the gate insulator layer 8 to thereby couple the gate terminal G to the gate region, defined by the channel between the source and drain regions. As is hereinafter discussed insulating stopper 1 and 2 and island 7 are further included in the integrated circuit chip of the prior art. It is appreciated that such elements comprise the integrated circuitry in the electronic timepiece hereinabove discussed. In such prior art complementary coupled P-channel and N-channel integrated circuit chips, the supply voltage $V_{DD}$ is a little larger than the sum of threshold voltages $V_{GT}$ of both channels ($V_{GTP} + V_{GTN}$), and the current consumption of such devices for charging and discharging circuits formed from such integrated circuit chips is increased by the drain parasitic capacitance $C_D$ effecting the charging and discharging speed which in turn determines the response time of the circuit.

It is appreciated that the parasitic capacitance $C_D$ of the drain terminal D is comprised of three capacitances: a capacitance $C_M$ formed between the aluminum wiring and the substrate, when stoppers such as 1 and 2 are used to separate and insulate the transistors; a junction capacitance $C_J$ between the diffused layer and the drain diffused layer and between the substrate and the drain diffused layer; and, a gate capacitance $C_G$ generated at the input of the next stage. In such prior art integrated circuit chips as depicted in FIG. 2, the source and drain terminals are formed by diffusing layers into the substrate, thus rendering inevitable the wiring capacitance $C_M$ and the junction capacitance $C_J$, resulting in increases in the parasitic capacitance $C_D$ thereof. For example, when a dividing circuit such as the one depicted in FIG. 3 is constructed, and is operated at high frequencies, the current consumption due to the parasitic capacitance is sharply increased due to increase in charging and discharging of such circuit. Accordingly, the response speed of the circuit is slowed down in order to correspond to the input period, and the operation of the circuit cannot be maintained by the limited supply voltage $V_{DD}$. Such defects at high frequencies occur even though such circuits function at lower frequencies.

It is further appreciated that in small-sized electronic timepieces such as wristwatches, the power source thereof is a small battery which due to the size thereof must have a low voltage and limited life. Thus, when a quartz crystal vibrator is utilized having the desired temperature sensitivity and operating at a high natural frequency, the stability of the circuit operation cannot be guaranteed. Moreover, the battery life is significantly shortened by the large amount of current consumed by the electronic circuit due to the parasitic capacitance, rendering the use of such integrated circuits in an electronic timepiece to be less than completely satisfactory.

It is further recognized that complementary coupled P-channel and N-channel field effect transistors must be insulated from each other when such transistors are integrated into a single circuit chip. As illustrated in FIG. 2, separation between the transistors is provided by utilizing the insulating effect of the diode-reverse characteristic of the P-N junction of the drain and stopper diffused layers, by providing heavily doped diffused layers 1 and 2 which are possessed of the same conductivity as the substrate to define the stoppers. However, the leak-drain breakdown voltage is easily reduced by inferior diode-reverse characteristics caused by faulty masks, defective photo etching techniques, differentiation between the diffusing masks, defective field insulating films, etc., which all occur when such transistors are manufactured. Furthermore, when insulation of the transistors is provided without the use of such stopper diffused layers, defective field films often cause marked increases in the leak current and in some cases the leak current increases along the grounded terminals while the device is not in use, or the breakdown voltage of the drain terminal is reduced. Accordingly, the manufacturing yield of such integrated circuit chips as well as the reliability thereof is lowered due to the incomplete insulation of the devices. Even when the distance between devices on a chip is increased in order to improve the insulation in and the drain breakdown voltage between the devices, the net effect is to increase the size of the integrated circuit chip, which is not a satisfactory result in a small-sized electronic timepiece.

Again making reference to the prior art integrated circuit structure depicted in FIG. 2, wherein diffused layers are used, an island 7 of a reverse conductivity with respect to the substrate 8 is utilized as a substrate for one of the transistors when forming the complementary coupled transistors. Since it is necessary to limit the impurity concentration of the island, the island layer must be diffused deeper than the source-drain diffused layers 1 through 6. Accordingly, the island occupies a large lateral space, which thereby increases space between the P-channel and N-channel transistors and increases the size of the integrated circuit chip.

Figure 5:
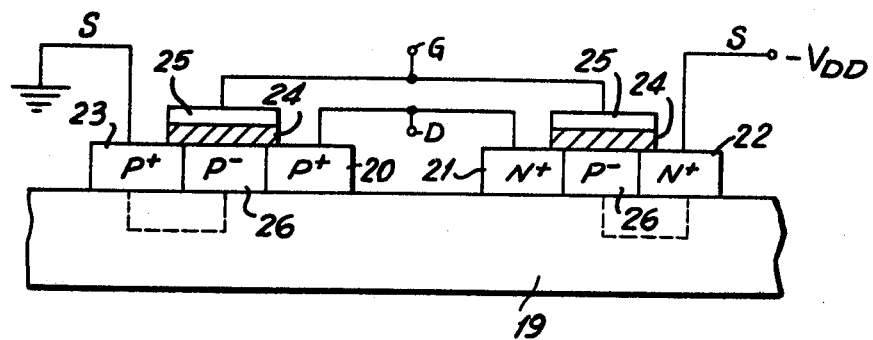
FIG. 5 is a sectional view of integrated circuit chip including a complementary coupled P-channel depletion-layer field effect transistor and an N-channel reverse-layer field effect transistor constructed in accordance with the instant invention.

Reference is now made to FIG. 5 wherein a P-channel depletion-layer field effect transistor is complementary coupled to an N-channel reverse-layer field effect transistor through the drain terminals D and the gate terminals G thereof by integrating same on an insulating substrate 19 to provide insulation therebetween. A semiconductor insulating substrate structure (SIS) is formed by growing a monocrystalline silicon in the order of 1 to 1.5 microns in thickness on sapphire or spinel, the latter forming an insulator 19, to thereby provide a P-type substrate so that MOS transistors having a depletion-layer P-channel portion and a reverse-layer N-channel portion can be disposed thereon.

A first source terminal is coupled to a supply voltage $V_{DD}$ and the source terminals are coupled to the source regions 22 and 23 which are formed as layers on insulator 19. The drain terminals G are coupled to the drain regions 20 and 21 which are formed as layers on the insulator 19. The gate terminals G are coupled through conductive layers 25 formed of materials such as aluminum and the like and gate insulating layers 24 to the drain region 26. The two transistors are separated by the insulator 19 and the junction area between the drains 20 and 21. As is further illustrated, the channel region 26 of the transistors can be made considerably smaller than was possible in conventional integrated circuit field effect transistors. For this reason, the junction capacitance $C_J$ of drains 20 and 21 are considerably smaller than that of conventional transistors. Moreover, aluminum wiring is substantially disposed on the insulating substrate, thereby minimizing the parasitic capacitance which occurred in the prior art. Thus, the wiring capacitance $C_M$ is reduced in accordance with the reduction in the length of the aluminum wiring, thereby reducing the drain parasitic capacitance of such an integrated circuit chip to one half. Accordingly, the current consumption of a circuit utilizing such an integrated circuit chip is lowered by at least one half thereby rendering the circuit more likely to operate at a maximum response frequency $f_{max}$ at a supply voltage $V_{DD}$. Moreover, as devices are separated by the insulating substrate 19, the inferior diode characteristic which cause incomplete insulation is completely eliminated. Also, the drain breakdown voltage is improved because the drains have but a single junction portion with the thinly doped channel layers 26. Finally, because the intervals between the devices can be reduced in view of the improved insulation between the transistors, such integrated circuit chips can be manufactured in reduced dimensions while guaranteeing reliability and without concern for the deterioration caused by leak currents and a reduction in breakdown voltage. Accordingly, an integrated circuit chip manufactured in accordance with the instant invention is reduced in size and provides improved operating characteristics.

It is further appreciated, that since a transistor constructed in accordance with the instant invention does not require an island having conductivity which is reversed from the substrate as is required in a prior art integrated circuit chip, the necessity of including wide intervals between the P-channel and N-channel transistors is eliminated.

Figure 6:
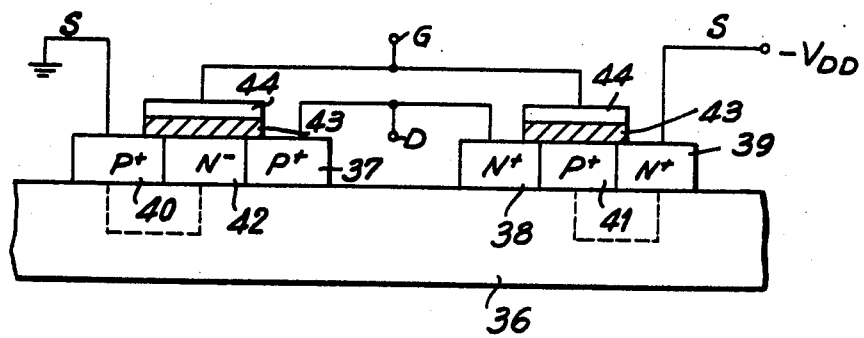
FIG. 6 is a sectional view of a complementary coupled P-channel reverse-layer and an N-channel reverse-layer field effect transistor integrated in a circuit chip constructed in accordance with an alternate embodiment of the instant invention.

Reference is made to FIGS. 6 wherein P-channel and N-channel reverse layer transistors are complementary coupled by connecting the gate terminals G and the drain terminals D and disposed on an integrated circuit chip having an insulator substrate 36. A source terminal S of the N-channel transistor is coupled to a supply voltage $V_{DD}$ and both source terminals S are coupled to their respective layers 39 and 40 defining source regions. The drain terminals D are coupled to their respective layers 37 and 38 which define the drain region. The gate terminals G are coupled to respective layers 42 and 41 which define the gate regions of the field effect transistors. It is noted that a wide interval between the P-channel and N-channel transistors is not necessary since the transistor channel regions 41 and 42, which are of reverse conductivities, are not produced as diffused layers and hence do not suffer from lateral expansion considerations which are prevalent when diffusing such layers. Accordingly, the chip size can be further reduced in view of the improved integration techniques herein disclosed.

Figure 7:
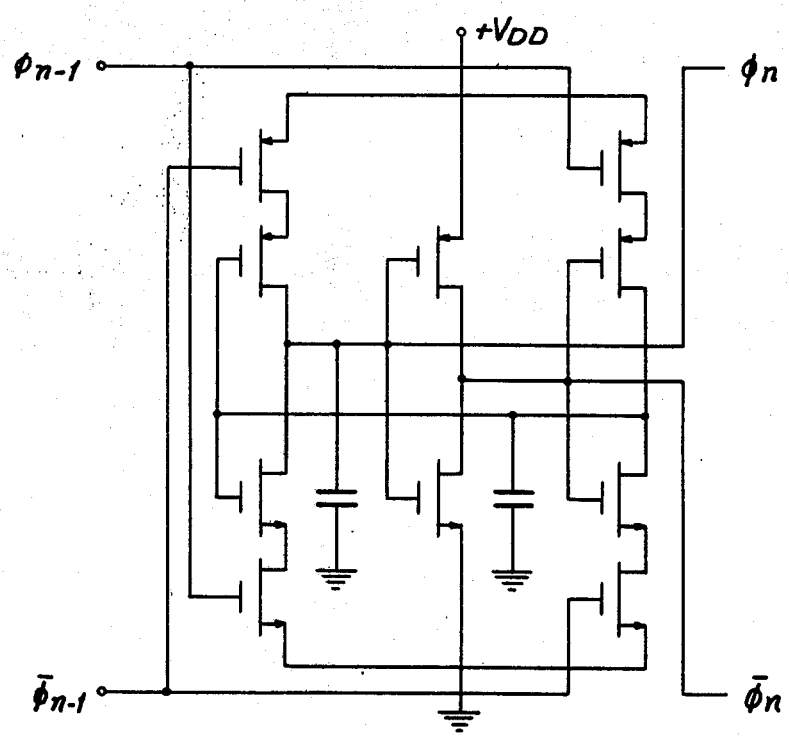
FIG. 7 is a circuit diagram of a dynamic divider circuit especially suitable for use in an electric timepiece.
Figure 8:
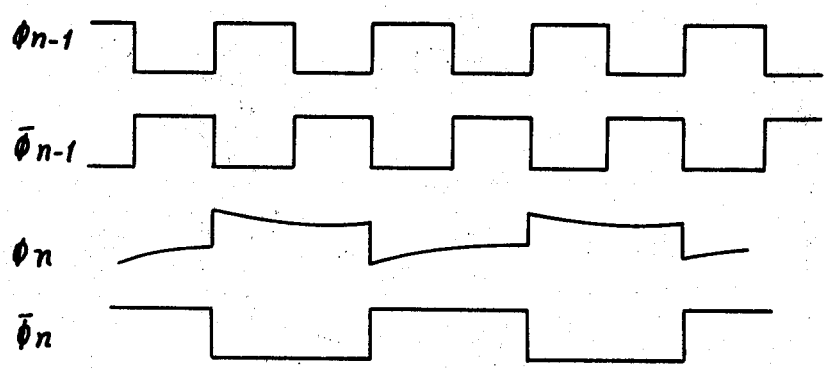
FIG. 8 is a wave diagram corresponding to the divider circuit depicted in FIG. 7.

Dynamic divider circuit chips as depicted in FIG. 7 and manufactured in accordance with the invention and the prior art were operated at high frequencies at a supply voltage $V_{DD}$ of 1.5 volts. The conventional divider had a current consumption of about 1 microamp where the input clock pulse $\phi_{n-1}$ was of a frequency of 100 KHz, and the maximum operating frequency $f_{max}$ was about 200 KHz. However, when the dynamic divider circuit of FIG. 7 was constructed in accordance with the instant invention, the current was of the order of 0.3 microamp or less, and the maximum operating frequency was 2 MHz with a reduction in the drain parasitic capacitance of more than 50 percent. Moreover, the amount of space occupied by a dividing circuit constructed in accorance with the instant invention was one half that of a circuit constructed in accordance with the prior art. Moreover, the deterioration in the reliability of such divider circuits manufactured in accordance with the invention caused by inferior insulation in the transistors is non-existent, thus guaranteeing improved reliability in circuits manufactured according to the instant invention.

It is further noted that the improved effect herein disclosed is realized in any integrated circuitry wherein the circuit elements are necessarily separated by insulating materials. It is further noted, that the semiconductor-insulating substrate structure of the type mentioned above can be constructed by forming semiconductor layers on insulating thin or thick layers such as silicon oxide or titanium oxide. Finally, it is noted that when the quartz crystal vibrator in the original oscillating circuit depicted in FIG. 1 has a high Q-value, a sensitive temperature characteristic and a high natural frequency, such as when GT, AT or DT-cut quartz crystal vibrators are utilized and the same is integrated into an insulator substrate, remarkable improvements in the operation of the circuit are noted. Thus, the instant invention is characterized in that the complementary coupled transistors comprising the electronic timepiece circuit including the oscillator circuit and entire divider circuit and additionally the encoder and the drive circuits are integrated into a single insulating substrate is operable at high frequencies utilizing lower currents which require lower voltages caused by reducing the drain capacitance and improving the reliability of such transistors integrated accordingly.

It sill thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In an electronic timepiece including an oscillator circuit for providing high frequency time standard signals, a divider circuit including a plurality of series-connected divider stages having applied thereto a high frequency time-keeping signal and in response thereto supplying low frequency timekeeping signals corresponding to present time, and display means for receiving and displaying time in response to said timekeeping signals counted by said dividing circuit, the improvement comprising said oscillator circuit and each of said divider stages being integrated on a single circuit chip having a substrate formed from an insulating material including complementary coupled P-channel and N-channel MOS field effect transistors formed on the insulating substrate thereof in layers, the respective transistors on said substrate having a space therebetween.

2. An electronic timepiece as claimed in claim 1, wherein said oscillator circuit includes a quartz crystal vibrator as the frequency standard of said oscillator circuit from the group consisting of AT, DT and GT cut-quartz crystals.

3. An electronic timepiece as claimed in claim 2 and including an encoding and driving circuit intermediate said dividing circuit and display means, said encoding and driving circuit means including complementary coupled P-channel and N-channel transistors being integrated on said insulating substrate.

4. An electronic timepiece as claimed in claim 3, wherein said insulating substrate is formed of a material selected from the group consisting of sapphire, spinel, silicon oxide or titanium oxide.

5. An electronic timepiece as claimed in claim 3 wherein the P-channel transistors are depletion-layer type transistors and the N-channel transistors are reverse-layer type transistors.

6. An electronic timepiece as claimed in claim 3, wherein said P-channel and N-channel transistors are reverse-layer channel transistors.

7. An electronic timepiece as claimed in claim 3, wherein each of said MOS field effect transistors include a layer of monocrystalline silicon on said insulator substrate defining the source, drain and channel regions thereof in side by side relation.

8. An electronic timepiece as claimed in claim 7, wherein each of said transistors includes an insulating layer on said monocrystalline silicon layer at least on the drain region thereof and electrical conductive material on said substrate, source and drain regions of said monocrystalline silicon and said insulating layer complementary coupling said transistors.

9. An electronic timepiece as claimed in claim 8, wherein said electrical conductive material is aluminum.

* * * * *